US008211622B2

(12) United States Patent
Kernig et al.

(10) Patent No.: US 8,211,622 B2

(45) Date of Patent: Jul. 3, 2012

(54) CONDITIONING OF A LITHO STRIP

(75) Inventors: Bernhard Kernig, Cologne (DE); Henk Jan Brinkman, Bonn (DE)

(73) Assignee: Hydro Aluminium Deutschland GmbH, Cologne (DE)

( * ) Notice: Subject to any disclaimer, the term of this patent is extended or adjusted under 35 U.S.C. 154(b) by 903 days.

(21) Appl. No.: 11/914,923

(22) PCT Filed: Apr. 5, 2006

(86) PCT No.: PCT/EP2006/061358

§ 371 (c)(1),
(2), (4) Date: May 9, 2008

(87) PCT Pub. No.: WO2006/122852

PCT Pub. Date: Nov. 23, 2006

(65) Prior Publication Data

US 2008/0227029 A1 Sep. 18, 2008

(30) Foreign Application Priority Data

May 19, 2005 (EP) .................................... 05010847

(51) Int. Cl.
*G03F 7/00* (2006.01)
*C11D 3/02* (2006.01)
*C23G 1/02* (2006.01)

(52) U.S. Cl. ........ 430/302; 510/245; 510/252; 510/254; 510/258; 510/269; 510/271; 510/272

(58) Field of Classification Search .................. 430/302; 510/245, 252, 254, 258, 269, 271, 272
See application file for complete search history.

(56) References Cited

U.S. PATENT DOCUMENTS

| | | | | |
|---|---|---|---|---|
| 3,699,013 | A | 10/1972 | Miyata et al. | |
| 3,723,162 | A * | 3/1973 | Leontaritis et al. | 428/626 |
| 4,256,601 | A * | 3/1981 | Sobata et al. | 510/245 |
| 4,321,290 | A * | 3/1982 | Thams | 204/485 |
| 4,397,721 | A * | 8/1983 | Exalto et al. | 205/706 |
| 4,400,289 | A * | 8/1983 | Geldner et al. | 510/270 |
| 4,547,274 | A | 10/1985 | Ohashi et al. | |
| 4,634,656 | A | 1/1987 | Ohashi et al. | |

(Continued)

FOREIGN PATENT DOCUMENTS

AT 386 614 B 9/1988

(Continued)

OTHER PUBLICATIONS

English abstract of JP 04-258697 (no date).*

(Continued)

*Primary Examiner* — Amanda C. Walke

(74) *Attorney, Agent, or Firm* — Proskauer Rose LLP

(57) ABSTRACT

A method of conditioning the surface of a work piece, particularly of a strip or sheet, more particularly of a lithostrip or lithosheet, including an aluminum alloy is provided. The method for conditioning the surface of a work piece and a work piece including an aluminum alloy enabling an increasing manufacturing speed in electro-chemically graining and maintaining at the same time a high quality of the grained surface, includes a conditioning method which comprises at least the two steps, degreasing the surface of the work piece with a degreasing medium and subsequently cleaning the surface of the work piece by pickling.

16 Claims, 1 Drawing Sheet a)

b)

c)

U.S. PATENT DOCUMENTS

| | | | | | |
|---|---|---|---|---|---|
| 4,741,863 | A * | 5/1988 | Yamamoto et al. | ........... | 510/245 |
| 4,877,495 | A * | 10/1989 | Buchmeier et al. | ........... | 205/106 |
| 4,945,004 | A * | 7/1990 | Sprintschnik et al. | ........ | 428/469 |
| 5,108,544 | A * | 4/1992 | Hakansson | ................... | 216/108 |
| 5,997,721 | A | 12/1999 | Limbach et al. | | |
| 6,447,982 | B1 * | 9/2002 | von Asten et al. | ......... | 430/278.1 |
| 6,890,700 | B2 * | 5/2005 | Tomita et al. | .............. | 430/271.1 |
| 2005/0013724 | A1 * | 1/2005 | Ougi et al. | .................... | 420/532 |
| 2007/0034606 | A1 * | 2/2007 | Dietsche et al. | .............. | 216/100 |

FOREIGN PATENT DOCUMENTS

| | | | |
|---|---|---|---|
| DE | 244 363 | A1 | 4/1987 |
| DE | 36 00 415 | A1 | 7/1987 |
| DE | 43 17 815 | C1 | 6/1994 |
| GB | 647 782 | A | 12/1950 |
| GB | 655 737 | A | 8/1951 |
| JP | 62 177191 | | 8/1987 |
| JP | 01246369 | A * | 10/1989 |
| JP | 04258697 | A * | 9/1992 |
| JP | 04258698 | A * | 9/1992 |
| JP | 10036895 | A * | 2/1998 |
| WO | WO 2005073432 | A1 * | 8/2005 |

OTHER PUBLICATIONS

English abstract of JP 04-258698 (no date).*
International Search Report for PCT/EP2006/061358.

* cited by examiner

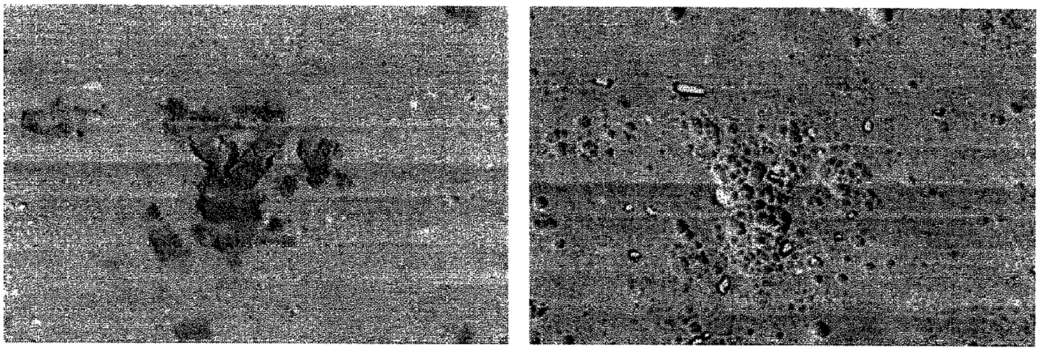
a)
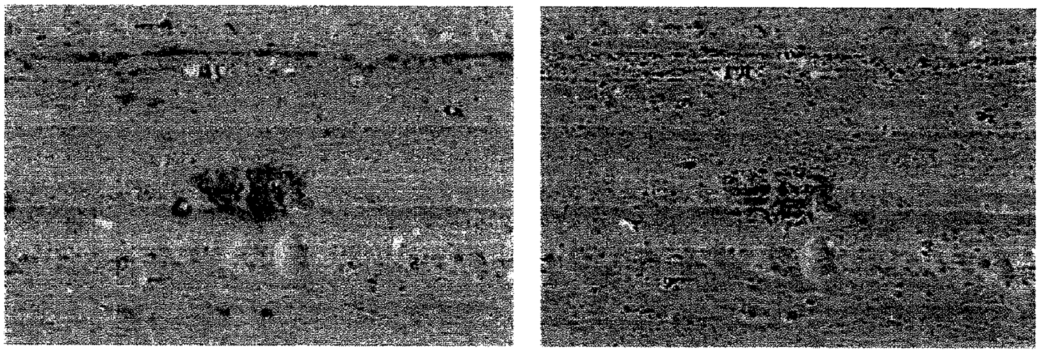
b)
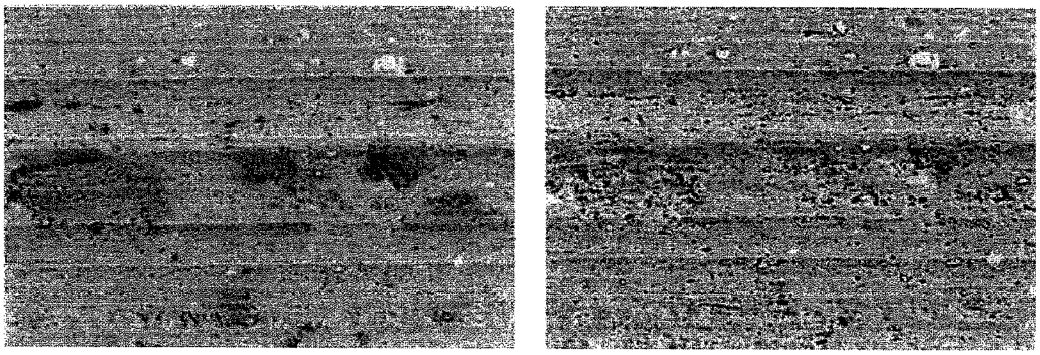
c)

CONDITIONING OF A LITHO STRIP

CROSS-REFERENCE TO RELATED APPLICATIONS

This application is a National phase Application of International Application No. PCT/EP2006/061358, filed Apr. 5, 2006, which claims the benefit of and priority to European Application No. 05 010 847.1, filed May 19, 2005, which is owned by the assignee of the instant application. The disclosure of each of the above applications is incorporated herein by reference in its entirety.

FIELD OF THE INVENTION

The invention relates to a method of conditioning the surface of a work piece, particularly of a strip or sheet, more particularly of a lithostrip or lithosheet, including an aluminium alloy.

BACKGROUND

Work pieces such as strips or sheets including an aluminium alloy are often surface treated after finishing rolling to prepare them for the next manufacturing step. In particular strips or sheet for lithographic printing are conditioned to achieve a predetermined surface roughness in a subsequent graining process. Lithostrips or sheets are usually degreased after finishing rolling. As known from the U.S. Pat. No. 5,997,721, degreasing respectively cleaning of the surface is done in one step by anodising the aluminium alloy sheet with AC current in an acidic electrolyte bath. Another way to degrease or clean aluminium slivers is known from the German patent DE 43 17 815 C1 namely the use of an alkaline medium.

Prior to electro-chemical graining of the lithostrips, they can be subjected to sodium hydroxide in a pre-treatment to degrease and clean the surface again. This step takes place in principle at the side of the manufacture of lithographic printing plates. Due to the increasing manufacturing speed during electro-chemical graining of the lithostrips time for pre-treatment of the surface of the lithostrips and for the electro-chemical graining itself decreases. Due to the increasing manufacturing speed the pre-treatment with sodium hydroxide is not sufficient enough to remove all contaminants from the surface of the lithostrip. As a consequence, the results in electro-chemically graining are not stable and surface defects occur on electro-chemically grained lithostrips or sheets. A reduction of the manufacturing speed causes higher production costs for lithographic printing plates.

SUMMARY OF THE INVENTION

In one embodiment, the invention provides a method for conditioning the surface of a work piece and a work piece including an aluminium alloy enabling an increasing manufacturing speed in electro-chemical graining and maintaining at the same time a high quality of the electro-chemical grained surface of the work piece.

According to one embodiment, the present invention provides a method of conditioning the surface of an aluminium work piece including an aluminium alloy, which method comprises at least the two steps degreasing the surface of the work piece with a degreasing medium and subsequently cleaning the surface of the work piece by pickling.

A combination of the two step conditioning method with the effected pre-treatment with sodium hydroxide prior to the electro-chemical graining of the lithostrips leads to stable results in the electro-chemical graining even if manufacturing speeds are increased. The conditioning method provides surfaces of an aluminium work piece which are almost free of subsurface oxide particles introduced by rolling without anodising the surface of the aluminium work piece. As a result, the surface of the aluminium alloy work piece conditioned with the method is fully grained during electro-chemical graining at charge densities which are distinctly lower than needed in electro-chemical graining after conventional cleaning, i.e. the charge density is less than 900 C/dm$^2$.

According to an embodiment of the invention an alkaline or an acid medium or an organic solvent can be used as degreasing medium to degrease the surface of the work piece. An organic solvent such as isopropyl-alcohol degreases the surface of the aluminium work piece effectively whereas alkaline or acid degreasing media has the additional advantage that the surface of the aluminium work piece is sensitised for the following pickling step.

According to an embodiment of the conditioning method a further improvement with respect to removal of rolling oil is achieved if the degreasing medium contains at least 1.5 to 3% by weight of a composite of 5-40% sodium tripolyphosphate, 3-10% sodium gluconate, 30-70% soda and 3-8% of a composite of non-ionic and anionic surfactants. The described degreasing medium removes rolling oil and other contaminants from the surface of the conditioned aluminium work piece with a high effectiveness. Preferably, the degreasing effect of the degreasing medium can be enhanced if the temperature of the degreasing medium increases.

Preferably, sodium hydroxide is utilised for pickling. Using sodium hydroxide in pickling, a good removal of oxide islands on the surface of the aluminium work piece is achieved, in particular at elevated temperatures, i.e. equal or more than 70° C. Furthermore, even at lower temperatures sodium hydroxide supports a stable electro-chemical graining process with increased manufacturing speed. Furthermore, hydrofluoric acid can be used as well for pickling.

According to a further advantage, an embodiment of the method of pickling comprises AC-cleaning with phosphoric acid. During AC-cleaning an alternating current supports pickling process and phosphoric acid is used as electrolyte. Phosphoric acid attacks in particular the oxide islands on the surface of the aluminium work piece which are introduced during rolling. The aluminium of the surface of the lithostrip is not attacked very strongly. Using AC-cleaning with phosphoric acid after the degreasing step of the method a good removal of oxide islands and contaminants from the surface of the aluminium work piece is achieved. AC-cleaning is also possible using as electrolyte sulphuric acid.

According to an embodiment of the invention, phosphoric acid is utilised for pickling. Phosphoric acid, even in absence of an AC current, has the advantage that it attacks mainly the oxide islands on the surface of the aluminium work piece and leads to a removal of small amount of the aluminium of the work piece itself. As a consequence pickling can be accomplished without removing too much aluminium from the surface of the work piece. The results achieved by pickling only with phosphoric acid are superior compared to the pickling with phosphoric acid supported by AC current. The absence of any oxide film, which is built during AC-cleaning, can be the reason for the superior results of phosphoric acid in combination with the degreasing step.

Preferably, the work piece is a strip or a sheet, in particular a lithostrip or a lithosheet. In this case the necessary electro-chemical graining process for manufacturing lithostrips or lithosheets can be accomplished thoroughly within less time and the manufacturing speed can be increased. Furthermore, the charge density needed can be reduced while providing a fully grained strip or sheet surface.

More preferably, the conditioning method is accomplished subsequent the manufacturing of a strip, in particular a lithostrip, and the conditioned strip is reeled on a coil. In this case a coil of a conditioned lithostrip can be provided comprising an optimum performance in further electro-chemical graining processes used to manufacture lithographic printing plates.

According to one embodiment, the present invention provides a work piece including an aluminium alloy conditioned by the method. As outlined before, the work piece provides a cleaned surface with an optimum performance for a subsequent electro-chemical graining process.

More preferably, the work piece is a strip or a sheet, in particular a lithostrip or a lithosheet. Lithostrip or sheets are produced for lithographic printing plates and differ from "normal" sheets due to the aluminium alloy they include and their specific thickness, which is typically less than 1 mm. Furthermore, the surface of lithostrips and sheets has to be prepared for a roughening process, since manufacturing of lithographic printing plates generally comprises an electro-chemical graining process to prepare the surface of the lithographic printing plates for the printing process. With the sheets or strips, in particular with the lithosheets or lithostrips, the necessary electro-chemical graining of the surface can be accomplished in shorter time with a reduced charge carrier density.

Beside an optimised surface of the work piece, the mechanical features and an improved graining structure during electro-chemical graining can be provided if the aluminium alloy of the work piece is one of the aluminium alloys AA1050, AA 1100, AA3103 or AlMg 0.5. These aluminium alloys provide the mechanical strength needed for lithographic printing plates while enabling due to the low amount of alloying constituents a homogeneous graining of the surface. Work pieces including other aluminium alloys may provide the same advantages.

According to an embodiment of the work piece the aluminium alloy contains the following alloying constituents in percent by weight:

Si<0.1%,
0.3%≦Fe≦0.4%,
Cu<0.01%,
Mn<1.1%,
Mg<0.2%,
Zn<0.01%,
Ti<0.01%,
impurities each less than 0.005% in sum max.
0.15%, rest Al.

The aluminium alloy can have state of the art mechanical and graining properties, in particular when the lithostrip including said aluminium alloy is conditioned with the method.

BRIEF DESCRIPTION OF THE DRAWINGS

FIG. 1*a* shows pictures of a transmission electron microscope (SEM) of an aluminium alloy work piece conditioned according to the invention.

FIG. 1*b* shows pictures of a transmission electron microscope (SEM) of an aluminium alloy work piece conditioned according to the invention.

FIG. 1*c* shows pictures of a transmission electron microscope (SEM) of an aluminium alloy work piece conditioned according to the invention.

DETAILED DESCRIPTION

The method of conditioning the surface of an aluminium work piece as well as the work piece can be designed and developed further in many different ways. In this respect, it is referred to the dependent claims of the independent claims 1 and 8 as well as to the description of embodiments of the present invention in connections with the drawings. The drawings in FIG. 1*a*) to 1*c*) show pictures of a transmission electron microscope (SEM) of the surface of an aluminium alloy work piece conditioned with methods according to three different embodiments of the present invention.

In one embodiment of the invention, the work piece includes a cold rolled AlMg 0.5 aluminium alloy. The results achieved with a AlMg 0.5 aluminium alloy are representative for the other aluminium alloys mentioned in the claims, too. On the left side, FIG. 1*a*) to 1*c*) show SEM pictures of a degreased surface of the work piece, where degreasing has been accomplished by a medium containing at least 1.5-3% by weight of a composite of 5-40% sodium tripolyphosphate, 3-10% sodium gluconate, 30-70% soda and 3-8% of a composite of non-ionic and anionic surfactants. The dark areas are identified as rolled-in subsurface oxide islands. These oxide islands are typically not removed during degreasing. The capability of the pre-treatments prior to the electro-chemical graining to remove subsurface oxide islands is very important to improve the results of electro-chemical graining, since the oxide islands prevent the respective surface area from being grained. In FIG. 1*a*) on the right side the work piece surface of the left picture of FIG. 1*a*) is shown after a treatment with sodium hydroxide with a concentration of 50 g/l for 10 s and at a temperature of 80° C. according to one embodiment of the conditioning method.

On the one hand pickling with sodium hydroxide at the elevated temperature has removed almost completely the oxide island which indicates the interaction between the two conditioning steps of degreasing and pickling. On the other hand the pitted structure indicates that pickling already attacks the bulk material of the work piece surface. This pitted structure may be avoided by reducing the temperature or the time of pickling with sodium hydroxide.

FIG. 1*b*) shows on the right a SEM picture of the surface of the work piece conditioned with an AC-cleaning in a phosphoric acid electrolyte. The AC-cleaning is accomplished in the present embodiment of the invention with a current density of 10 A/dm$^2$ with a concentration of phosphoric acid of 20% at a temperature of 80° C. for 10 s. Comparing left SEM picture after degreasing and the right SEM picture after degreasing and pickling with AC-cleaning in phosphoric acid it can be derived that small parts of the black coloured oxide island has been left on the work piece surface. A pitted structure which indicates that the bulk material has been attacked, has not been observed with AC-cleaning in phosphoric acid in this embodiment of the present invention.

FIG. 1*c*) presents the surface of the aluminium work piece conditioned with phosphoric acid as a second step. In comparison with the degreased work piece surface, pickling with phosphoric acid shows that the oxide islands are attacked mainly and removed from the work piece surface without leaving a pitted structure as shown after a conditioning with sodium hydroxide. The pickling with phosphoric acid shows the best results with respect to removing of subsurface, rolled-in oxide islands. The parameters regarding concentration, temperature and application time are variable and depend on each other. Hence, similar results may be achievable with different parameters.

The two-step method of conditioning the surface of aluminium work pieces provides almost complete removal of rolled-in subsurface oxide islands enabling a reduction of the charge entry during electro-chemical graining to achieved a fully grained surface. Since fully grained surfaces are particularly desired in manufacturing lithosheets and lithostrips an advantageous pre-treatment prior electro-chemical graining is presented with the conditioning method.

To investigate the ability of the two-step conditioning of the aluminium work piece to be applied in a mass production further test with different concentrations, temperatures has been done. As a result, for phosphoric acid with concentrations from 20% to 50%, at temperatures more or equal than 70° C. an application time of 0.1 s to 10 s shows good results with respect to a removal of subsurface oxide islands on the aluminium workpiece. Hence, the two step conditioning method of the surface of aluminium work pieces can be applied even in a mass production of conditioned aluminium work pieces.

What is claimed is:

1. A method of conditioning a surface of a lithostrip or a lithosheet including an aluminium alloy, the method comprising:

degreasing the surface of the lithostrip or the lithosheet with a degreasing medium; and immediately thereafter, without intervening steps, cleaning the surface of the lithostrip or the lithosheet by pickling, wherein sodium hydroxide is utilized for pickling.

2. The method according to claim 1, wherein an alkaline or an acid medium or an organic solvent is used as the degreasing medium.

3. The method according to claim 1, wherein the degreasing medium comprises at least 1.5 to 3% by weight of a composite of 5-40% sodium tripolyphosphate, 3-10% sodium gluconate, 30-70% soda and 3-8% of a composite of non-ionic and anionic surfactants.

4. The method according to claim 1 further comprising, conditioning the surface of the lithostrip or the lithosheet subsequent to manufacturing the lithostrip or the lithosheet and reeling the conditioned lithostrip or lithosheet on a coil.

5. A lithostrip or lithosheet including an aluminium alloy produced by conditioning a surface of the lithostrip or lithosheet comprising:

degreasing the surface of the lithostrip or the lithosheet with a degreasing medium; and immediately thereafter, without intervening steps, cleaning the surface of the lithostrip or the lithosheet by pickling with at least one of sodium hydroxide or phosphoric acid.

6. The lithostrip or lithosheet according to claim 5, wherein the aluminium alloy comprises aluminium alloys AA 1050, AA 1100, AA 3103 or AlMg 0.5.

7. The lithostrip or lithosheet according to claim 5, wherein the aluminium alloy comprises in percent by weight:

Si<0.1%,
0.3% ≦Fe≦0.4%,
Cu<0.01%,
Mn<1.1%,
Mg<0.2%,
Zn<0.01%,
Ti<0.01%, impurities each less than 0.005% in sum max. 0.15%, rest Al.

8. A method of conditioning a surface of a lithostrip or a lithosheet including an aluminium alloy, the method comprising:

degreasing the surface of the lithostrip or the lithosheet with a degreasing medium; and immediately thereafter, without intervening steps, cleaning the surface of the lithostrip or the lithosheet by pickling, wherein phosphoric acid is utilized for pickling.

9. The method according to claim 8, wherein pickling comprises AC-cleaning with phosphoric acid.

10. The method according to claim 8, wherein an alkaline or an acid medium or an organic solvent is used as the degreasing medium.

11. The method according to claim 8, wherein the degreasing medium comprises at least 1.5 to 3% by weight of a composite of 5-40% sodium tripolyphosphate, 3-10% sodium gluconate, 30-70% soda and 3-8% of a composite of non-ionic and anionic surfactants.

12. The method according to claim 8 further comprising conditioning the surface of the lithostrip or the lithosheet subsequent to manufacturing the lithostrip or the lithosheet and reeling the conditioned lithostrip or lithosheet on a coil.

13. The method according to claim 8, wherein the aluminium alloy comprises aluminium alloys AA 1050, AA 1100, AA 3103 or AlMg 0.5.

14. The method according to claim 8, wherein the aluminium alloy comprises in percent by weight:

Si<0.1%,
0.3% ≦Fe≦0.4%,
Cu<0.01%,
Mn<1.1%,
Mg<0.2%,
Zn<0.01%,
Ti<0.01%, impurities each less than 0.005% in sum max. 0.15%, rest Al.

15. The method according to claim 1, wherein the aluminium alloy comprises aluminium alloys AA 1050, AA 1100, AA 3103 or AlMg 0.5.

16. The method according to claim 1, wherein the aluminium alloy comprises in percent by weight:

Si<0.1%,
0.3% ≦Fe≦0.4%,
Cu<0.01%,
Mn<1.1%,
Mg<0.2%,
Zn<0.01%,
Ti<0.01%, impurities each less than 0.005% in sum max. 0.15%, rest Al.

* * * * *